United States Patent Office 3,061,435
Patented Oct. 30, 1962

3,061,435
LITHOGRAPHIC PRINTING PLATES AND AZIDO COMPOSITIONS THEREFOR

Martha Tomanek and Wilhelm Neugebauer, Wiesbaden-Biebrich, Germany, assignors, by mesne assignments, to Azoplate Corporation, Murray Hill, N.J.

No Drawing. Continuation of abandoned application Serial No. 498,780, Apr. 1, 1955. This application Sept. 5, 1957, Ser. No. 682,084
Claims priority, application Germany Apr. 3, 1954
3 Claims. (Cl. 96—75)

This invention relates to lithographic printing plates and light sensitive coatings therefor. More particularly, the invention is concerned with pre-sensitized printing foils and with the sensitizers used thereon.

For a long time photo-mechanical printing plates for flat bed and offset printing have been produced by coating a suitable support, e.g. a metal plate or foil, such as aluminum or zinc, paper foils, cellulose acetate foils, etc. with a light hardenable colloidal substance, e.g. albumin, gelatine, fishglue, etc., containing a light-sensitive substance. The printing plate is produced in this process by exposing the light-sensitive layer to an original (containing the image to be reproduced) and the resultant image is then finished by development of the layer. It is possible to produce both positive and negative printing plates from a positive original by this method. More recently the practice has been to produce the light-sensitive layers without using a colloidal substance by coating the foil with a solution of a light-sensitive substance itself. If the light-sensitive substance is insoluble in water, organic solvents may be used to prepare the solution. The coating is subsequently dried. An image is then transferred to the plate by exposing the light sensitive layer to light through a transparent original. Thereafter, by treatment with a suitable developer agent, all those areas which are not to accept ink (hereinafter referred to as non-imaged areas) are removed, leaving only those areas of the exposed layers which are to accept greasy ink in the printing process (hereinafter referred to as the imaged areas). The imaged areas may be either those areas struck by light (in which case a printing plate with a positive image and positive prints may be obtained from a negative master) or the imaged areas may be those areas not struck by light (in which case a printing plate may give a positive image from a positive original). The undesired areas of the originally light sensitive layer are removed (i.e. development of the image) by treating the layer with dilute alkaline or dilute acid solutions or also with organic solvents, depending upon the difference in solubility between those areas to be removed and those areas which remain. Generally, the development is followed by washing with water, treating with dilute acid, and finally applying the greasy ink.

An object of the invention is the provision of a novel light sensitive material usable for the production of lithographic printing plates. A further object is the production of presensitized printing foils which are capable of being stored for long periods of time prior to being used while still retaining their light sensitivity. A still further object of the invention is the provision of a lithographic printing plate capable of long runs. Other objects and advantages will be readily apparent from a reading of the description hereinafter following.

The present invention is concerned with a process for the photomechanical production of printing plates of the latter type described, in which process a sheet-like material consisting of a support coated with a colloid-free light-sensitive layer is exposed under an original and then developed. We have now found that printing plates are advantageously produced by a photomechanical process from a metallic support (e.g. an aluminium foil or zinc plate) provided with a colloid-free light sensitive layer, if azido compounds of substances which contain a multinuclear imidazole system are used for the preparation of the light sensitive layer. After the light sensitive material is exposed to light under a master, the azido compound is removed from those parts of the layer which were not struck by light during exposure by wiping over the layer with dilute alkaline solutions, which step may be preceded or accompanied by a treatment of the exposed layer with an organic solvent. The image side of the support is then washed with water and treated with dilute acid. The multinuclear imidazole structure may be a condensed or an uncondensed one.

The azido compounds of substances which contain a multi-nuclear uncondensed imidazole system may correspond to the following general formulae:

(I)

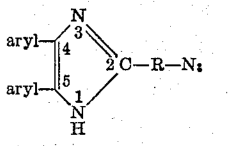

Azido compounds of substances which contain a multinuclear condensed imidazole system are preferably used. They may correspond, to one of the following general formulae:

(II)

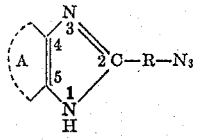

(III)

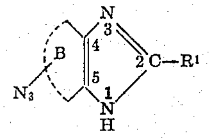

or (IV)

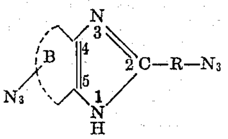

wherein: A and B represent aromatic ring systems which include the carbon atoms in the 4 and 5 position of the imidazole ring. Such ring systems may be the benzene, naphthalene, acenaphthene, acenaphthylene, phenanthrene, or fluorene ring. R and $R^1$ stand for a member of the group consisting of aliphatic, araliphatic, aromatic, or heterocyclic residues, and $R^1$ may also stand for hydrogen.

Whenever the terms "aromatic," "aliphatic," "araliphatic," and "heterocyclic" residues are used it is understood that they include within their scope substituted as well as unsubstituted "aromatic," "aliphatic," "araliphatic," and "heterocyclic" residues, respectively.

The azido compounds to be used according to the present invention are prepared by diazotizing the corresponding amines and then transforming the diazonium compounds which are obtained, in acid solution into the corresponding azides by adding sodium azide. The following compounds are listed as examples of the azido compounds of the invention:

*Formula 1*

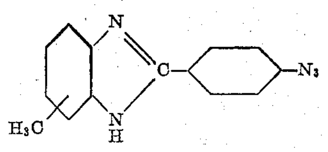

The 2-(4'-azido-phenyl)-5(or 6)-methyl-benzimidazole (melting point 115° C.) is prepared by condensing 3,4-diamino-toluene with 4-nitrobenzaldehyde at a temperature of 15° C. below zero in alcoholic solution. To the reaction mixture containing the monobenzal compound of the 3,4-diamino-toluene nitrobenzene is added and after evaporation of the alcohol the mixture is heated to the boiling point of nitrobenzene. On cooling this reaction mixture there crystallizes the 2-(4'-nitrophenyl)-5(or 6)-methylbenzimidazole (melting point 108°–113° C.). At 80° C. this nitrocompound is catalytically reduced with Raney nickel to form 2-(4'-amino-phenyl)-5(or 6)-methyl-benzimidazole (melting point 164–165° C.). The amino compound is readily diazotized with sodium nitrite in a hydrochloric acid solution, whereupon the diazonium compound formed dissolves. By adding sodium azide to the yellow solution, the hydrochloride of 2-(4'-azido-phenyl)-5(or 6)-methylbenzimidazole separates as a colorless precipitate. The imidazole base is obtained by adding a sodium carbonate solution.

*Formula 2*

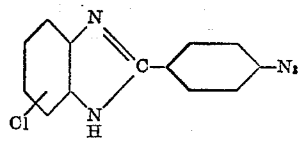

The 2-(4'-azido-phenyl)-5(or 6)-chloro-benzimidazole (melting point 104° C.) is prepared from 3,4-diamino-diphenyl- and 4-nitro-benzaldehyde in analogy to the preparation of the compound of Formula 1.

*Formula 3*

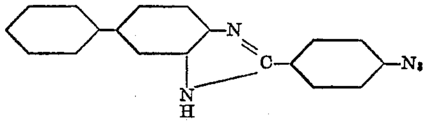

The 2-(4'-azido-phenyl)-6-phenyl-benzimidazole (melting point 162° C. with decomposition) is prepared from 3,4-diamino-diphenyl and 4-nitro-benzaldehyde in analogy to the preparation of the compound of Formula 1.

*Formula 4*

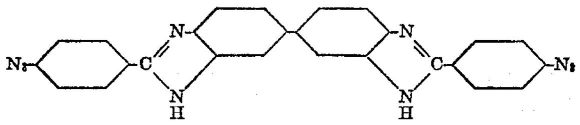

The 2,2'-[4'',4'''-bis-(azido-phenyl)]-diphenyl-diimidazole (which does not melt up to 400° C.) is obtained from 3,3'-diamino-benzidine and 4-nitro-benzaldehyde in analogy to the preparation of the compound of Formula 1.

*Formula 5*

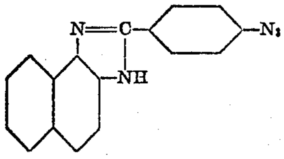

The 2-(4''-azido-phenyl)naphtho-imidazole-(1',2':4,5) (melting point 147° C. with decomposition) is prepared from 1,2-diamino-naphthalene and 4-nitro-benzaldehyde in analogy to the preparation of the compound of Formula 1.

*Formula 6*

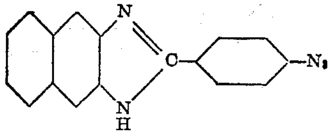

The 2-(4''-azido-phenyl)-naphtho-imidazole-(2',3':4,5) (does not melt up to 360° C.) is prepared from 2,3-diamino-naphthalene and 4-nitro-benzaldehyde in analogy to the preparation of the compound of Formula 1.

*Formula 7*

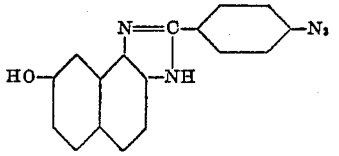

The 2-(4''-azido-phenyl)-7'-hydroxy-naphthoimidazole-(1',2':4,5) (does not melt up to 360° C.) is prepared from 1,2-diamino-7-hydroxy-naphthalene and 4-nitro-benzaldehyde in analogy to the preparation of the compound of Formula 1.

*Formula 8*

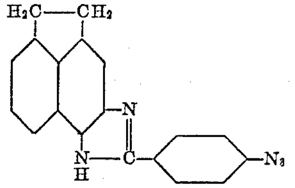

The 2-(4'-azido-phenyl)-acenaphthimidazole (melting point 164° C.) is prepared from 4,5-diamino-acenaphthene and 4-nitro-benzaldehyde in analogy to the preparation of the compound of Formula 1.

*Formula 9*

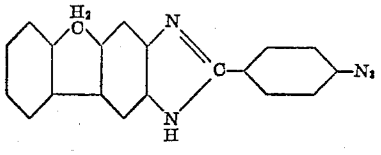

The 2-(4'-azido-phenyl)-fluorene-imidazole (does not melt up to 360° C.) is prepared from 2,3-diamino-fluorene and 4-nitro-benzaldehyde in analogy to the preparation of the compound of Formula 1.

*Formula 10*

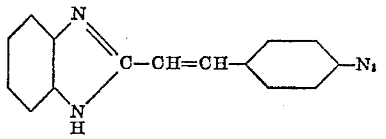

The 2-(4'-azido-styryl)-benzimidazole (melting point 157–158° C.) is prepared from 2-(4'-nitro-styryl)-benzimidazole, obtained by melting 2-methyl-benzimidazole with 4-nitro-benzaldehyde at a temperature of 210° C. over a period of 2 hours, analogously to the preparation of 2-styryl-5(or 6)-nitro-benzimidazole. At room temperature the nitro compound is catalytically reduced with Raney nickel to form the amino compound, and the amino compound is then transformed into the azide as described in connection with the preparation of the compound of Formula 1.

*Formula 11*

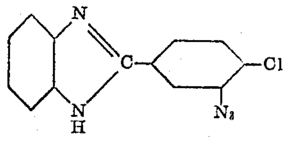

The 2-(4'-chloro-3'-azido-phenyl)-benzimidazole (melting point 17° C.) is prepared from 1,2-phenylene-diamine and 4-chloro-3-nitro-benzaldehyde in analogy to the preparation of the compound of Formula 1.

*Formula 12*

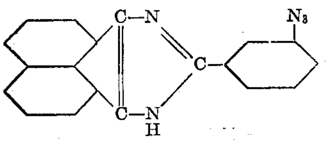

The 2-(3′-azido-phenyl)-acenaphthimidazole (melting point 119–120° C.) is obtained from 2-(3′-nitro-phenyl)-acenaphthimidazole (no melting point; changes color when heated to 220° C. and higher) as described by Anukul Chandra Sircar and Nirmal Chandra Guha-Raya in "Journal of the Indian Chemical Society," 6.93.98.28/2. At a temperature of 80° C. said nitro compound is catalytically reduced with Raney nickel to form the amino compound, and the amino compound is then converted into the azide as described in connection with the preparation of the compound of Formula 1.

*Formula 13*

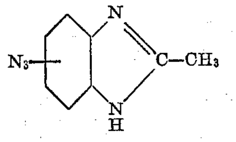

The 2-methyl-5(or 6)-azido-benzimidazole (melting point 173° C., with decomposition) can be obtained from 2-methyl-5(or 6)-amino-benzimidazole by diazotization and subsequent conversion of the diazonium compound into the azido compound by means of sodium azide.

*Formula 14*

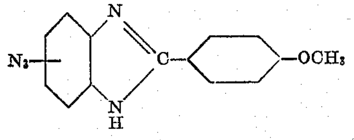

The 2 - (4′ - methoxy - phenyl) - 5(or 6) - azido-benzimidazole (melting point 80° C.) is prepared from 4-niltro-1,2-phenylenediamine and anisaldehyde in analogy to the preparation of the compound of Formula 1.

*Formula 15*

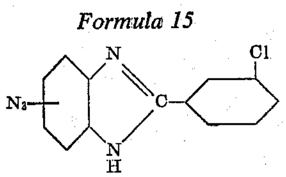

The 2 - (3′ - chloro - phenyl) - 5(or 6) - azido-benzimidazole (melting point 108–112° C., with decomposition) is prepared from 4-nitro-1,2-phenylenediamine and 3-chloro-benzaldehyde in analogy to the preparation of the compound of Formula 1.

*Formula 16*

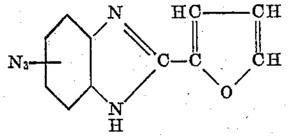

The 2-α-furyl-5(or 6)-azido-benzimidazole (does not melt up to 360° C.) is prepared from 4-nitro-1,2-phenylenediamine and furfurol in analogy to the preparation of the compound of Formula 1.

*Formula 17*

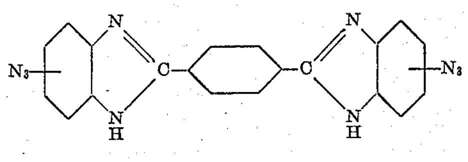

The 1,4 - bis - [(5 or 6) - azido - benzimidazole - 2]-benzene (melting point 146° C.) is prepared from 2 moles of 4-nitro 1,2-phenylenediamine and 1 mol of terephthalaldehyde in analogy to the preparation of the compound of Formula 1.

*Formula 18*

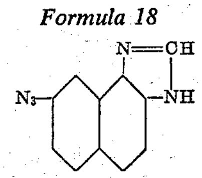

The 7′-azido-naphtho-1′,2′:4,5-imidazole (does not melt up to 360 °C.) is prepared from 7-amino-naphtho-imidazole-1′,2′:4,5 (melting point 252–253° C.) by diazotization and subsequent conversion of the diazonium compound into the azido compound by means of sodium azide.

*Formula 19*

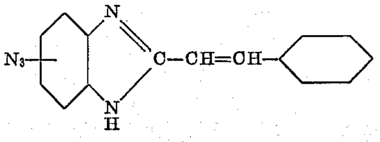

The 2-styryl-5(or 6)-azido-benzimidazole (does not melt up to 400° C.) is prepared from 2-styryl-5(or 6)-amino-benzimidazole (melting point 195–200° C.) by diazotization and subsequent transformation of the diazonium compound into the azido compound by means of sodium azide; the 2-styryl-5(or 6)-amino-benzimidazole has been described by Krym and Jurkowsky in "Berichte der deutschen chemischen Gesellschaft," vol. 49 (1916), page 2687.

*Formula 20*

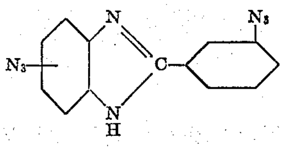

The 2 - (3′ - azido - phenyl) - 5(or 6) - azido - benzimidazole (melting point 100° C. with decomposition) is prepared from 3-nitro-1,2-phenylenediamine and 3-nitro-benzaldehyde analogously to the preparation of the compound of Formula 1.

*Formula 21*

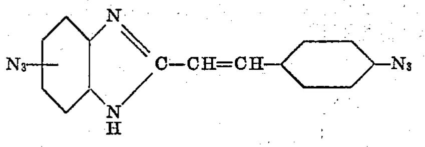

The 2-(4′-azido-styryl)-5(or 6)-azido benzimidazole (melting point 98° C. with decomposition) is prepared from 2 - (4′ - amino - styryl) - 5(or 6) - amino - benzimidazole (melting point 237–238° C.), which compound is described by Krym and Jurkowski in "Berichte der deutschen chemischen Gesellschaft," vol. 49 (1916), page 2691. The diamino compound is first tetrazotized and then converted into the diazide by means of sodium azide.

*Formula 22*

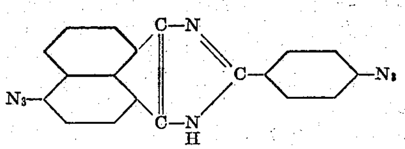

The 2 - (4′ - azido-phenyl)-6-azido-acenaphthimidazole (melting point 160° C., with decomposition) is prepared from 5-nitro-acenaphthene-quinone and 4-nitro-benzaldehyde analogously to the preparation of the compound of Formula 12.

*Formula 23*

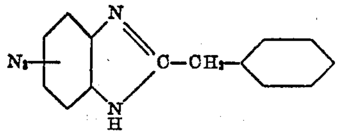

The 2-benzyl-5(or 6)-azido-benzimidazole (melting point 85–86° C.) is obtained from 4-nitro-1,2-phenylenediamine and phenyl-acetaldehyde analogously to the preparation of the compound of Formula 1.

*Formula 24*

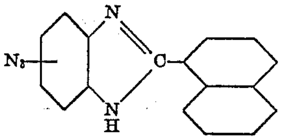

The 2-naphthyl-5(or 6)-azido-benzimidazole (melting point 92–96° C.) is obtained from 4-nitro-1,2-phenylenediamine and 1-naphthaldehyde analogously to the preparation of the compound of Formula 1.

*Formula 25*

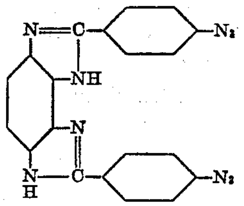

The 2′,2″-bis-(4-azido-phenyl)-(diimidazolo-4′,5′:1,2; 4″,5″:3,4-benzene) (does not melt up to 300° C.) is obtained from 2′,2″-bis-[4-amino-phenyl]-[diimidazolo-4′, 5′:1,2;4″,5″:3,4-benzene] by tetrazotization and subsequent transformation of the tetrazo compound into the corresponding diazide by means of sodium azide in an acid solution; 2′,2″-bis-[4-amino-phenyl]-[diimidazolo-4′, 5′:1,2;4″,5″:3,4-benzene] was described by Krym in "Berichte der deutschen chemichen Gesellschaft," vol. 44 (1911), page 2919.

*Formula 26*

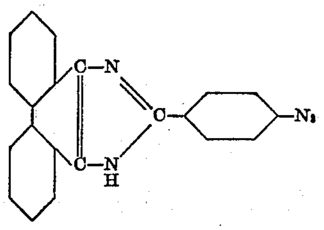

The 2-(4′-azido-phenyl)-phenanthro-9,10:4,5-imidazole (melting point 170° C., with decomposition) is obtained from 2-(4′-nitro-phenyl)-phenanthro-imidazole. This compound is first catalytically reduced to form the amino compound, from which the azide is obtained by diazotization and subsequent reaction with sodium azide. 2-(4′-nitro-phenyl)-phenanthro-imidazole is prepared from phenanthrene-quinone and 4-nitrobenzaldehyde analogously to the preparation of 2-(2′-nitro-phenyl)-phenanthro-imidazole described by Anukul Chandra Sirkar and Nirmal Chandra Guha-Raya in "Journal of the Indian Chemical Society," vol. 127, pages 1048 and 1049.

*Formula 27*

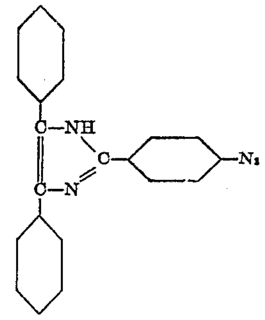

The 2-(4′-azido-phenyl)-4,5-diphenyl-imidazole (melting point 166° C. with decomposition) is obtained from 2-(4′-amino-phenyl)-4,5-diphenyl-imidazole (melting point 180° C.) by diazotization and subsequent conversion of the diazonium compound into the azido compound by reaction with sodium azide in an acid solution. The 2-(4′-amino-phenyl)-4,5-diphenyl-imidazole has been described in "Journal für praktische Chemie" (2), vol. 64 (1901), page 542.

The light-sensitive material to be used for the production of printing plates is preferably prepared by coating an aluminum foil (the surface of which may be chemically or electrochemically oxidized) with a solution of the azido compound to be used as the light-sensitive substance. The solution may be applied to the support by spreading or spraying, or by means of a plate whirler. The layer thus produced on the support is then dried. For the preparation of the coating solutions organic solvents, such as alcohol, dioxane, glycol monomethyl ether, pyridine, benzene, or mixtures of such solvents may be used. The azido compounds according to the present invention may also be used in mixtures with each other. This has proved to be of particular advantage when the compounds tend to crystallize. If a mixture of several azido compounds is used, a smooth layer free of undesired crystallization effects is formed on the support.

In order to prepare a printing plate from the light sensitive material thus produced, the latter is exposed under a transparent original in the customary manner. For exposure, an arc lamp or mercury vapour lamp may be used. The images obtained are clearly visible, being colored shades of red or brown. After exposure, the unexposed areas of the layer are removed by means of dilute, e.g. 1–10% alkaline solutions, preferably 1–3% solutions of caustic soda, sodium carbonate, trisodium phosphate, or a mixture of trisodium phosphate and disodium phosphate, to which solutions organic solvents, such as ethyl alcohol, methyl alcohol, acetone, methyl-ethyl-ketone, dioxane or glycol monomethyl ether may be added. The light struck areas of the layer remain on the support and are receptive to greasy ink, after the plate has been rinsed with water and treated with dilute acid, preferably dilute phosphoric acid. For this purpose, after rinsing with water, the plate is either wiped over first with dilute acid and then with greasy ink, or greasy ink and acid are applied simultaneously. A positive printing plate is obtained from a negative pattern, or a negative printing plate from a positive pattern. Inking with greasy ink may be done either manually or in the printing machine.

The unexposed areas of the layer may also be removed by means of solvents, such as xylene, benzene or gasoline.

The printing plates produced according to the present invention allow for the running of a very high number of copies. The storage capacity of the unexposed light-sensitive material is exceptional, even under unfavorable atmospheric conditions. Plates stored for 25 days in a sweat box remain unchanged.

The following examples are given to further illustrate the light-sensitive material of the invention and are not intended as being limitative of the scope thereof.

EXAMPLES (1) A solution containing 1 part by weight of 2-(4′-azido-phenyl)-5(or 6)-meth: l-benzimidazole (corresponding to Formula 1) in 100 parts by vol. of glycol monomethyl ether is coated onto a superficially roughened aluminum foil, for instance by means of a plate whirler, and the coating is then dried. The coated side of the foil is then exposed under a transparent negative pattern, e.g. an 18 amp. arc lamp at a distance of 60 cm. An exposure of 1 minute duration is usually sufficient. The exposed foil is then wiped over first with alcohol (50%), then with a 3% trisodium phosphate solution. After this treatment, the foil is thoroughly rinsed with water and then rubbed in with 3% phosphoric acid and greasy ink. Greasy ink adheres to those areas of the layer which were struck by light during exposure. This means, that a reversed image of the pattern becomes visible on the foil, i.e. a positive image, when a negative was used. The foil is then clamped into an offset printing machine and may be used for running large numbers of copies.

(2) The procedure described in Example 1 is repeated, but for coating the aluminum foil there is used a solution of 1 part by weight of 2-(4′-azido-phenyl)-5(or 6)-chloro-benzimidazole (corresponding to Forumla 2) and 0.5 part by weight of 2-(4′-azido-phenyl)-6-phenyl-benzimidazole (corresponding to Formula 3) in 100 parts by vol. of dioxane. As in Example 1, a positive image is obtained from a negative pattern.

(3) An anodically oxidized aluminum plate is coated with a solution containing 1 part by weight of 2-(4″-azido-phenyl)-naphtho-2′,3′:4,5-imidazole (corresponding to Forumla 6) in 100 parts by vol. of a dioxane/ethyl alcohol mixture (1:1). The coated foil is then dried and its layer side exposed under a transparent negative pattern. The exposed side of the foil is then wiped over first with xylene, then with a 5% phosphoric acid solution and finally with greasy ink, in the presence of water. A positive image appears and a positive printing plate is obtained.

Instead of the latter mentioned solution, a solution of 2-(4″-azido-phenyl)-naphtho-1′,2′:4,5-imidazole (Formula 5) or
2-(4′-azido-phenyl)-acenaphthimidazole (Formula 8) or
2-(4′-azido-phenyl)fluorene-imidazole (Formula 9) or
2,2′-[4″,4‴-bis-(azido-phenyl)]diphenyl-diimidazole Formula 4)

may be used to prepare the light sensitive layer. In the unexposed state, these plates have an almost unlimited shelf-life.

(4) A solution of 1 part by weight of 2-(4″-azido-phenyl)-7′-hydroxy-naphtho-1′,2′:4,5-imidazole (corresponding to Formula 7) in 100 parts by vol. of glycol monomethyl ether is used for coating a superficially roughened aluminum foil, and the coated foil is then treated as in Example 1, with the exception that the exposed foil is not treated with alcohol and a trisodium phosphate solution, but only with a 1 percent caustic soda solution, then well rinsed with water and wiped over with a 3 percent phosphoric acid. After inking with greasy ink a positive printing plate is obtained from a negative pattern.

(5) A solution of 0.5 part by weight of 2-(4′-azido-phenyl)-6-azido-acenaphthimidazole (corresponding to Formula 22) in 100 parts by vol. of dioxane is used for coating an aluminum foil, and the coated foil is then treated as in Example 1, with the exception that the exposed surface of the foil is treated with a 3 percent sodium carbonate solution, to which 1 percent of glycol monomethyl ether was added, then rinsed well with water and wiped over with greasy ink and 2 percent sulfuric acid. A positive image is obtained from a negative pattern.

(6) 1 part by weight of 2-(4′-methoxy-phenyl)-5(or 6)-azido-benzimidazole (corresponding to Formula 14) dissolved in 100 parts by vol. of alcohol is coated on an aluminum plate and the layer is then dried. The layer side of the plate is exposed under a transparent negative pattern and the exposed side is then treated with alcohol (50 percent) and then with a mixture of equal parts by volume of a 3 percent disodium phosphate and a 3 percent trisodium phosphate solution. The layer is then rinsed with water, inked with greasy ink, and wiped over dith dilute phosphoric acid. A reversed image of the negative pattern is obtained, i.e. a positive image and consequently a positive printing plate.

Instead of the solution mentioned above a solution of one of the following compounds may be used to prepare the light sensitive layer:

2-(3′-chloro-phenyl)-5(or 6)-azido-benzimidazole (Formula 15) or
2-α-furyl-5(or 6)-azido-benzimidazole (Formula 16) or
2-methyl-5(or 6)-azido-benzimidazole (Formula 13) or
7′-azido-naphtho-1′,2′:4,5-imidazole (Formula 18).

(7) Superficially roughened aluminum foil is coated with a solution of 1 part by weight of a mixture containing equal parts of 2-(4′-azido-styryl)-benzimidazole (Formula 10) 2-styryl-5(or 6)-azido-benzimidazole (Formula 19) and 2-(3′-azido-phenyl)-5(or 6)-azido-benzimidazole (Formula 20) in 100 parts by vol. of dioxane. Further procedure is given in Example 1.

(8) 1 part by weight of 2-(4′-chloro-3′-azido-phenyl)-benzimidazole (corresponding to Formula 11) is dissolved in 100 parts by vol. of a dioxane/alcohol mixture (1:1). Further treatment of the solution and the light sensitive aluminum foil produced therewith is as stated in Example 1, with the exception that the exposed layer is treated with a 3 percent sodium carbonate solution. A positive printing plate is obtained from a negative pattern.

(9) An aluminum foil is coated with a solution containing 0.5 part by weight of 2-(3′-azido-phenyl)-acenaphthimidazole (corresponding to Formula 12) in 100 parts by vol. of glycol monomethyl ether. The foil is then treated as in Example 1, with the difference that the exposed foil is first treated with benzene, then with 3 percent acetic acid, and is finally inked with greasy ink in the presence of 1 percent phosphoric acid. A positive image is obtained when a negative pattern was used.

Instead of the above mentioned solution a solution of 1,4-bis-[5(or 6)-azido-benzimidazole-2]-benzene (corresponding to Formula 17) or a solution of 2-(4′-azido-styryl)-benzimidazole (corresponding to Formula 10) may be used for the preparation of the light sensitive layer.

(10) 1 part by weight of 2-benzyl-5-(or 6)-azido-benzimidazole (corresponding to Formula 23) is dissolved in 100 parts by vol. of glycol monomethyl ether, and an aluminum plate is coated with this solution and dried. The layer thus produced on the foil is exposed under a transparent negative pattern, then treated with a 1 percent sodium carbonate solution, rinsed with water, and inked with greasy ink in the presence of dilute phosphoric acid. A positive printing plate is obtained.

(11) An aluminum foil is coated with a solution containing 0.5 part by weight of 2-naphthyl-5(or 6)-azido-benzimidazole (corresponding to Formula 24) and 0.5 part by weight of 2-(4′-azido-phenyl)-phenanthro-9,10;4,5-imidazole (corresponding to Formula 26) in 100 parts by volume of dioxane. The foil is then treated as in Example 1, with the exception that the exposed layer is first wiped over with xylene, then with a 3 percent phosphoric acid and greasy ink. A positive image is obtained, when a negative pattern was used.

(12) 1 part by weight of 2′,2″-bis-(4-azido-phenyl)-(diimidazolo-4′5′:1,2;4″,5″:3,4-benzene) (corresponding to Formula 25) is dissolved in 100 parts by volume of glycol monomethyl ether. An aluminum plate is coated with this solution and the layer thus produced is dried.

The layer on the plate is exposed to light under negative pattern, and the exposed layer is then first treated with 80 percent alcohol and subsequently with a mixture containing equal parts of 3 percent disodium phosphate and 3 percent trisodium phosphate. After rinsing with water, the plate is rubbed in with greasy ink and dilute phosphoric acid. A positive image and consequently a positive printing plate is obtained.

(13) An aluminum foil is coated with a solution containing 1 part by weight of 2-(4'-azido-phenyl)-4,5-diphenyl-imidazole (corresponding to Formula 27) dissolved in 100 parts by vol. of glycol monomethyl ether. After exposure under a pattern the exposed layer is treated with a 1 percent trisodium phosphate solution, rinsed with water and then rubbed in simultaneously with greasy ink and dilute phosphoric acid. A positive image is obtained from a negative pattern.

This application is a continuation of application Serial No. 498,780, filed April 1, 1955, and now abandoned.

What is claimed is:

1. Light sensitive material for the production of lithographic printing plates comprising a base having a thin and uniform light sensitive coating thereon, said coating consisting of the azido compound

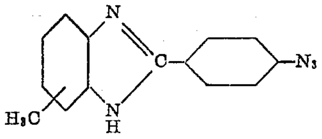

2. A presensitized lithographic printing plate capable of being inked and having reproductions made therefrom comprising an aluminum base having on one surface thereof a layer consisting of the light sensitive compound of the formula:

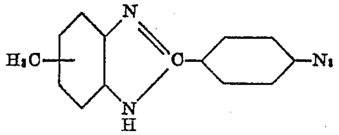

3. A compound having the formula

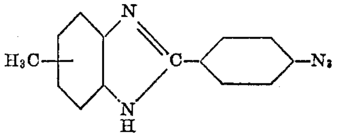

References Cited in the file of this patent

FOREIGN PATENTS

| | | |
|---|---|---|
| 763,721 | Germany | Oct. 5, 1953 |
| 858,195 | Germany | Dec. 4, 1952 |

OTHER REFERENCES

Boyer et al.: "Alkyl and Aryl Azides," Chem. Reviews, vol. 54, 1954 (received in Patent Office February 16, 1954), pages 1–57. (Copy in Sci. Library.)